US007008731B2

(12) United States Patent
Nojima et al.

(10) Patent No.: US 7,008,731 B2
(45) Date of Patent: Mar. 7, 2006

(54) METHOD OF MANUFACTURING A PHOTOMASK AND METHOD OF MANUFACTURING A SEMICONDUCTOR DEVICE USING THE PHOTOMASK

(75) Inventors: Shigeki Nojima, Yokohama (JP); Osamu Ikenaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 10/374,094

(22) Filed: Feb. 27, 2003

(65) Prior Publication Data

US 2003/0162105 A1   Aug. 28, 2003

(30) Foreign Application Priority Data

Feb. 28, 2002   (JP) .............................. 2002-054774

(51) Int. Cl.
*G03F 9/00*   (2006.01)
*G03C 5/00*   (2006.01)

(52) U.S. Cl. ........................................... 430/5; 30/311
(58) Field of Classification Search .................. 430/5, 430/30, 22, 311
See application file for complete search history.

(56) References Cited

U.S. PATENT DOCUMENTS

| | | | |
|---|---|---|---|
| 5,202,748 A | 4/1993 | MacDonald et al. | |
| 5,821,015 A | 10/1998 | Sugawara | |
| 5,877,861 A | 3/1999 | Ausschnitt et al. | |
| 5,965,306 A | 10/1999 | Mansfield et al. | |
| 6,016,357 A | 1/2000 | Neary et al. | |
| 6,334,209 B1 | 12/2001 | Hashimoto et al. | |
| 6,366,822 B1 | 4/2002 | Heavlin | |

FOREIGN PATENT DOCUMENTS

| | | |
|---|---|---|
| JP | 06-051497 | 2/1994 |
| JP | 07-175204 | 7/1995 |
| JP | 08-202020 | 8/1996 |
| JP | 2000-181045 | 6/2000 |
| JP | 2000-241959 | 9/2000 |
| JP | 2000-258352 | 9/2000 |

OTHER PUBLICATIONS

Sugawara, M. et al., "Influence of Process Latitude on Exposure Characteristics", SPIE, vol. 2726, pp. 583-597 (1996).
Wong, A. K. et al., "Level-Specific Lithography Optimization for 1-Gb DRAM", IEEE Transactions on Semiconductor Manufacturing, vol. 13, No. 1, pp. 76-87, (Feb. 2000).
Itoh, M. et al., "Method of Manufacturing Photomask", U.S. Appl. No. 09/940,578, filed Aug. 29, 2001.

*Primary Examiner*—Saleha R. Mohamedulla
(74) *Attorney, Agent, or Firm*—Finnegan, Henderson, Farabow, Garrett & Dunner, L.L.P.

(57) ABSTRACT

A method of manufacturing a photomask includes determining dimensions of a pattern in a photomask, determining an exposure latitude on the basis of the dimensions of the mask, and judging if the photomask is defective or non-defective on the basis of whether or not the exposure latitude falls within a prescribed exposure latitude. The pattern in the photomask includes dimensions of critical pattern portions in which an exposure latitude is low.

14 Claims, 6 Drawing Sheets

▽ 51
□ 52

⊖ 54

⊕ 53

| ITEMS | SPECIFICATION VALUSE |
|---|---|
| Deviation of average value of patterned dimension from target dimension | ±10nm or less |
| In-plane uniformity of patterned dimension | 8nm (3σ) or less |
| Linearity of patterned dimension | ±20nm or less |
| Residual error of patterned location | 20nm (3σ) or less |
| Magnification error of patterned location | 0.2ppm or less |
| Orthogonal error of patterned location | 0.2ppm or less |
| Defect | Free from defects 150nm or more in size |
| Deviation of average value of transmittance from target transmittance | ±0.2% |
| In-plane uniformity of permeability | ±0.1% |
| Deviation of average value of phase from 180 degrees | ±3 degrees |
| In-plane uniformity of phase | ±1.5 degrees |

FIG. 8

| ITEMS | SPECIFICATION VALUSE | MEASURED VALUES |
|---|---|---|
| Deviation of average value of patterned dimension from target dimension | ±10nm or less | 13nm |
| In-plane uniformity of patterned dimension | 8nm (3σ) or less | 4nm |
| Linearity of patterned dimension | ±20nm or less | 15nm |
| Residual error of patterned location | 20nm (3σ) or less | 13nm |
| Magnification error of patterned location | 0.2ppm or less | 0.1ppm |
| Orthogonal error of patterned location | 0.2ppm or less | 0.1ppm |
| Defect | Free from defects 150nm or more in size | Free from defect |
| Deviation of average value of transmittance from target transmittance | ±0.2% | −0.15% |
| In-plane uniformity of permeability | ±0.1% | ±0.07% |
| Deviation of average value of phase from 180 degrees | ±3 degrees | ±2.1 degrees |
| In-plane uniformity of phase | ±1.5 degrees | ±1.1 degrees |

FIG. 9

METHOD OF MANUFACTURING A PHOTOMASK AND METHOD OF MANUFACTURING A SEMICONDUCTOR DEVICE USING THE PHOTOMASK

CROSS-REFERENCE TO THE RELATED APPLICATIONS

This application is based upon and claims the benefit of priority from the prior Japanese Patent Application No. 2002-054774, filed Feb. 28, 2002, the entire contents of which are incorporated herein by reference.

BACKGROUND OF THE INVENTION

1. Field of the Invention

The present invention relates to a method of manufacturing a photomask and a method of manufacturing a semiconductor device using the photomask.

2. Description of the Related Art

The manufacturing process for semiconductor devices involves the patterning process of forming various patterns on a semiconductor wafer, the so-called lithography process. The lithography process uses photomasks.

In recent years, the dimensional accuracy required of photomasks has become increasingly severe. For example, the in-plane dimensional uniformity of the photomask is required to be 10 nm or less. In the manufacture of photomasks, there is a large number of items to decide whether they are defective or non-defective. Conventionally, photomasks that do not meet specifications in any one of the items have been considered to be defective, i.e., have been rejected.

FIG. 8 show typical items and specification values of specifications of a photomask (e.g., a half-tone phase-shifting mask). Even in FIG. 8, 11 items are listed. Conventionally, photomasks that exceed the specification value in at least one of the 11 items have been rejected. Although the accuracy of the photomask manufacturing techniques has been increased, the yield of non-defective products has decreased because the dimensional accuracy of the photomasks has become increasingly severe.

The specifications of photomasks are required in order to obtain a desired exposure latitude in exposing patterns onto a semiconductor wafer. The conventional specifications have been determined so that a desired exposure latitude will be obtained even if every item has been set to its critical specification value. With actual photomasks, however, it is very rare that every item is set to its critical specification value. In most of the photomasks, even if certain items are set to values in excess of their respective specification values, the other items are set to within their respective specification values with margin. Heretofore, such photomasks would have been rejected. We have found the fact that such rejected photomasks include photomasks that ensure the desired exposure latitude, i.e., photomasks that offer no problem in mass production of semiconductor devices. If, even in the presence of items that have been set to values in excess of their respective specification values, the other items have been set to within their respective specification values with margin, it is possible to obtain a desired exposure latitude as a whole. That is to say, if a decremental change in exposure latitude due to items that have exceeded specification values falls below an incremental change in exposure latitude due to items that conform to specification values, a desired exposure latitude will be obtained as a whole.

FIG. 9 shows the conventional measurements of a half-tone phase-shifting mask which was rejected. As shown in FIG. 9, in this mask, the deviation of the average value of the pattern dimension from its target value is 13 nm in excess of ±10 nm, the specification value, and the in-plane uniformity of the pattern dimension of the mask is 4 nm ($3\sigma$), which is sufficiently smaller than the specification value, 8 nm ($3\sigma$). When a wafer was actually exposed through this mask to measure the defocus latitude and the exposure latitude, the desired exposure latitude was obtained. Prior related applications by the assignee of this application include Japanese Patent Application No. 2000-260285 filed Aug. 30, 2000 and Japanese Patent Application No. 2001-159380 filed May 28, 2001. (U.S. patent application Ser. No. 09/940,578 filed Aug. 29, 2001.)

In Japanese Patent Application No. 2000-260285, variations in the dimensions of semiconductor device patterns on a photomask (mask pattern) and their average values are measured and the exposure latitude is calculated from the measured data. The photomask that meets the given exposure latitude is decided to be non-defective. In the case of a phase-shifting photomask, the transmission factor and phase difference of a phase shifting layer is further measured. The measured data is also used to calculate the exposure latitude. The photomask that meets the given exposure latitude is decided to be acceptable.

In contrast to Japanese Patent Application No. 2000-260285, Japanese Patent Application No. 2001-159380 is adapted to estimate exposure latitude from drawing position accuracy and measured data on defective regions and repaired regions after repair of defects as well, allowing more accurate acceptance/rejection decision. In addition, if the desired exposure latitude is not obtained from a photomask, a customer who uses the mask further decides whether it can be used in the lithography process from the point of view of device characteristics and device manufacture. That is, the acceptance/determination decision is made with process management conditions in mind.

Microstructuring and large scale integration of semiconductor devices are now in progress; accordingly, more accurate acceptance/rejection decision is required with photomasks as well.

BRIEF SUMMARY OF THE INVENTION

A method of manufacturing a photomask according to a first aspect of the invention comprises: determining dimensions of a pattern in a photomask including dimensions of critical pattern portions in which an exposure latitude is low; determining an exposure latitude on the basis of the dimensions of the mask; and judging if the photomask is defective or non-defective on the basis of whether or not the exposure latitude falls within satisfies a prescribed exposure latitude.

A method of manufacturing a semiconductor device according to a second aspect of the invention comprises: determining dimensions of a pattern in a photomask including dimensions of critical pattern portions in which an exposure latitude is low; determining an exposure latitude on the basis of the dimensions of the mask; judging if the photomask is defective or non-defective on the basis of whether or not the exposure latitude falls within a prescribed exposure latitude; and manufacturing a semiconductor device using a photomask that has been accepted on the basis of the judgment.

BRIEF DESCRIPTION OF THE SEVERAL VIEWS OF THE DRAWING

FIG. 8 is a diagram showing specification values of a half-tone phase-shifting mask; and FIG. 9 is a diagram showing measurements of the half-tone phase-shifting mask.

DETAILED DESCRIPTION OF THE INVENTION

Figure 1:
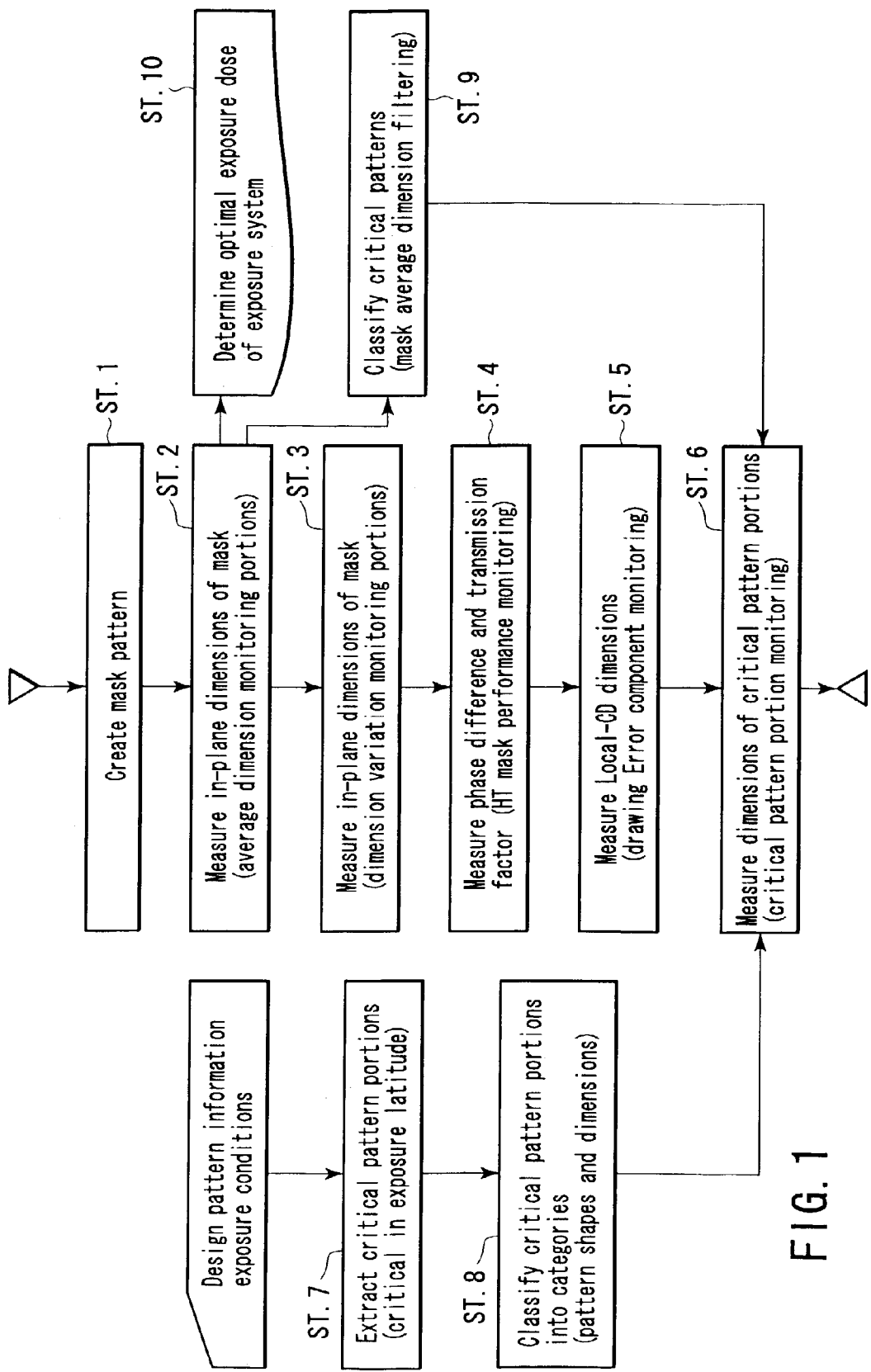
FIG. 1 is a flowchart illustrating a method of manufacturing a photomask in accordance with an embodiment of the present invention.

An embodiment of the present invention will be described hereinafter with reference to the accompanying drawings. In the description which follows, corresponding parts are denoted by like reference characters.

FIG. 1 is a flowchart illustrating a method of manufacturing a photomask in accordance with an embodiment of the present invention. The first embodiment is an application of the present invention to a half-tone phase-shifting mask (hereinafter referred to as an HT mask) as a photomask. It should however be noted that the present invention can be applied not only to HT masks but also to phase-shifting masks other than the HT masks and photomasks other than the phase-shifting masks, as described in U.S. patent application Ser. No. 09/940,578. Present application is based upon and claims the benefit of prior U.S. patent application Ser. No. 09/940,578, filed Aug. 29, 2001, the entire contents of which are incorporated herein by reference.

As shown in FIG. 1, mask patterns, e.g., semiconductor device patterns are formed on a mask blank (ST. 1).

In this embodiment, based on pattern data representing graphical patterns of a semiconductor device a desired semiconductor pattern is drawn on energy-sensitive material, for example, resist on an HT mask blank using, for example, an electron beam lithography system. Next, the device pattern consisting of a semi-transparent layer (half-tone layer) is formed on the glass substrate of the mask blank through development and etching processing. In this specification, the semiconductor device pattern refers to various patterns used in the manufacture of semiconductor devices, such as device isolation patterns, gate electrode patterns, contact and via holes, interconnection patterns, and ion implantation window patterns. To draw the mask pattern, use can be made of other drawing systems than the electron beam drawing (lithography) system, such as a laser beam drawing system or ion beam drawing system. Instead of drawing patterns, they may be transferred by the use of, for example, a reduction transfer system.

Next, the dimensions of the created semiconductor device pattern are measured and their deviations from design values are measured.

Figure 2A:
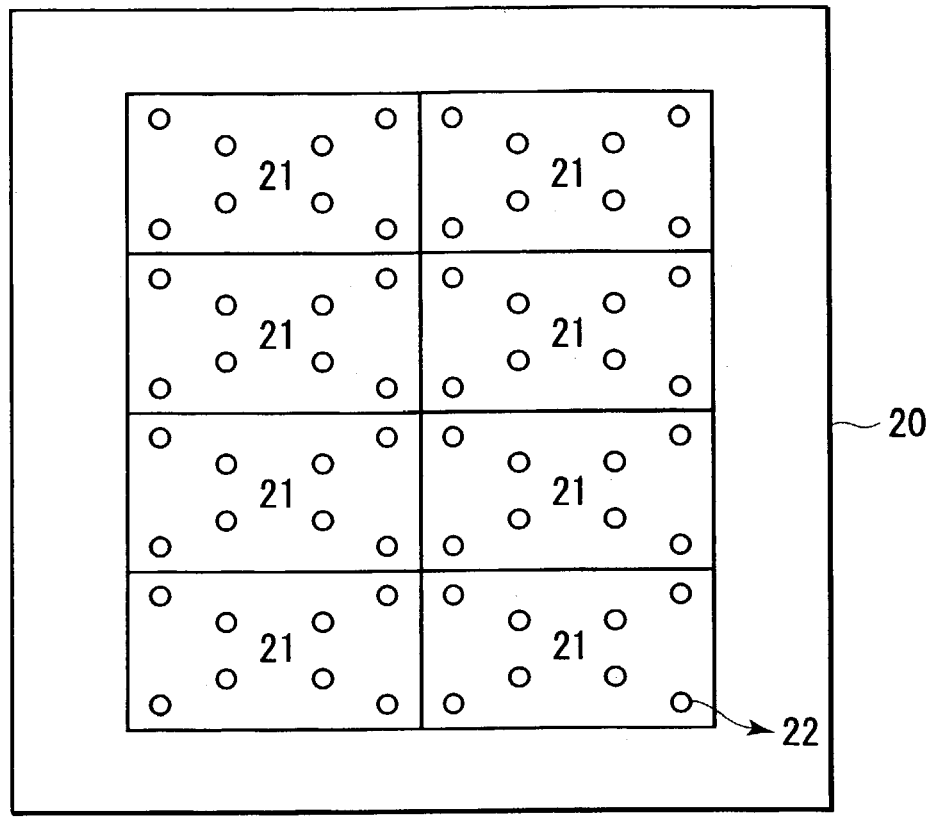
FIG. 2A is a plan view showing a pattern layout on a photomask.
Figure 2B:
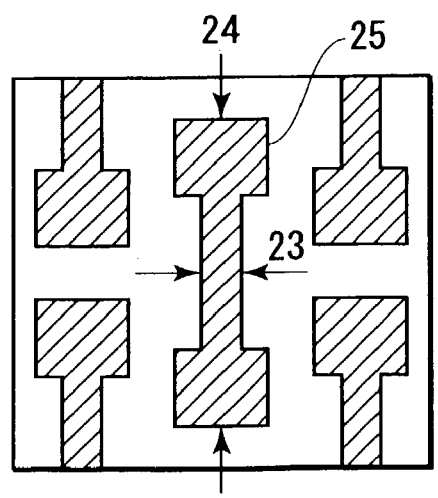
FIG. 2B is a plan view showing a unit pattern group.

FIG. 2A shows an example of a pattern layout on a photomask to be measured and FIG. 2B shows an example of a unit pattern group placed on the photomask.

In the pattern layout shown in FIG. 2A, a total of eight chips 21, each corresponding to a semiconductor device, is arranged in two columns and four rows. When each of the chips 21 is a semiconductor memory device, the greater part of it is taken up by an area in which such unit pattern groups as shown in FIG. 2B are arranged periodically in a matrix form. For example, a unit pattern 25 is extracted from such a unit pattern group and the dimensions of its portions indicated at 23 and 24 are measured. The unit pattern 25 takes the shape of a dumbbell having short and long axes. In this example, the dimension 23 along the short axis and the dimension 24 along the long axis of the dumbbell-shaped unit pattern 25 are measured at eight points 22 in each chip, i.e., 64 points in total. The averages of the measured dimensions are calculated as the average dimension values of the photomask (ST. 2). Further, variations in the dimensions at 64 measurement points 22 are calculated as dimension variation values (ST. 3). Next, a decision is made as to whether the average dimension values and the dimension variation values fall within specific management ranges for a specific mask manufacturing line. If they fall within the specific ranges, the procedure goes to the next measurement step; otherwise, it is decided that some abnormality exists with the result that the photomask is rejected and a new photomask is produced. It is assumed here that the average dimension values and the dimension variation values fall within the management ranges and hence the procedure goes to the next step.

The dimension measurements may include those for average dimension monitoring portions of a semiconductor device pattern which are utilized for optimizing the exposure conditions of an exposure system used to produce the semiconductor device pattern on an exposed body and those for dimension variation monitoring portions of the semiconductor device pattern which are used to calculate variations in the dimensions in a photomask.

The average dimension monitoring portions and the dimension variation monitoring portions may be either different or identical patterns. In the case of identical patterns, the dimensions of one of the patterns are simply measured to calculate average values and variations.

For acceptance/rejection decision of a created photomask, it takes too much time and labor and is therefore not practical to measure dimensions at each of the 64 measuring points 22 after exposure of a wafer through that photomask and then seek the exposure latitude. In this embodiment, the wafer exposure latitude is calculated from measured data for a photomask or estimated from actual exposure results. The photomask is decided to be defective or non-defective depending on whether the resulting exposure latitude is the desired one.

Next, when a photomask to be created is an HT mask, the phase difference and the transmission factor which is the inherent performance of a half-tone layer of a local pattern of each chip 21 or a monitor pattern placed outside the chips 21 are measured and their average values and variations are then calculated (ST. 4). Next, as in the case of the dimensions described previously, a decision is made as to whether they fall within management ranges for the mask manufacturing line. If they do, the procedure goes to the next measurement step. If, on the other hand, they do not, it is decided that some abnormality exists. Consequently, the photomask is rejected or the photomask is repaired.

Figure 3A:
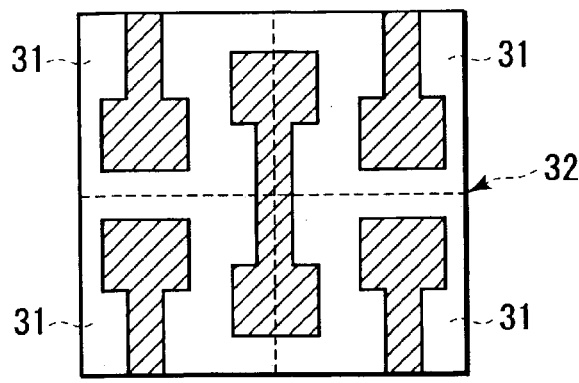
FIGS. 3A, 3B and 3C are plan views showing drawing errors in unit drawing areas.
Figure 4A:
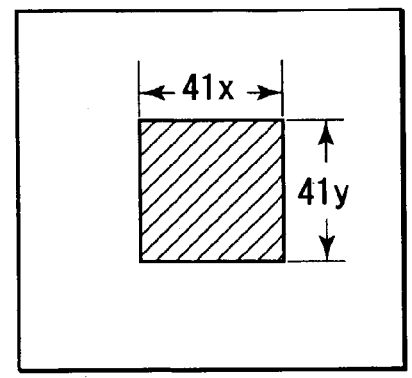
FIGS. 4A and 4B are plan views showing errors made in forming patterns by drawing apparatus.
Figure 3B:
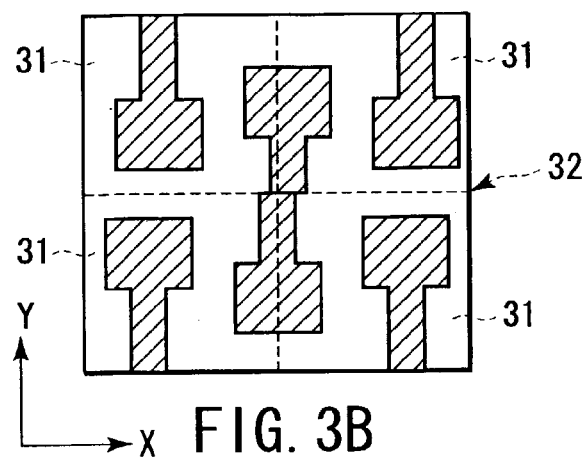
Figure 4B:
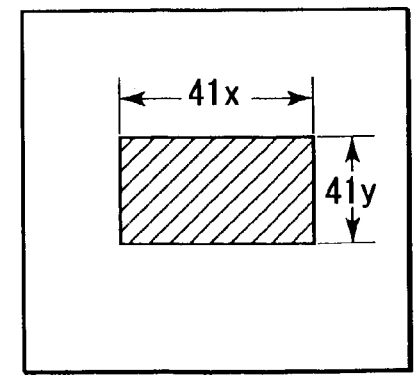
Figure 3C:
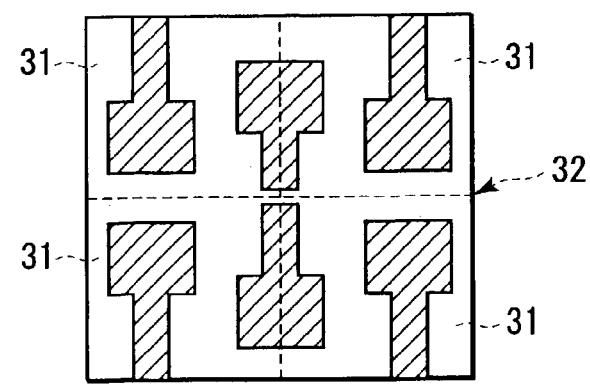

The photomask which has been accepted in the above step is divided, as shown in FIG. 3A, into unit drawing areas (areas which can be drawn only by beam deflection means) 31 inherent in a drawing system. In border portion 32 there arise drawing errors, such as pattern displacement as shown in FIG. 3B, a gap between patterns as shown in FIG. 3C, and pattern overlapping not shown. The pattern displacement occurs not only in the X direction but also in the Y direction. As the result, dimension errors of patterns located in the boarder portion 32 become greater than those for identical patterns formed in other locations. In addition, there arises an error such that a pattern which is a square ($41x=41y$) in design as shown in FIG. 4A becomes a rectangle ($41x\neq 41y$) as shown in FIG. 4B. This is due to the XY difference which is a pattern formation error of drawing systems. The XY difference is a minute pattern formation error for X and Y having identical dimensions.

Such errors of connection between the unit drawing areas 32 (hereinafter referred to as the butting accuracy) and the XY difference are obtained by measuring the patterns in the chips 21 or the monitor patterns located outside the chips 21 (ST. 5).

From the average dimension values and the dimension variation values obtained in ST. 2 and ST. 3, the average value and the variation of the phase difference and the average value and the variation of the transmission factor obtained in ST. 4, the butting accuracy and the XY difference obtained in ST. 5, and exposure conditions for exposure processing using the design pattern or the photomask, the differences between the actually created mask and an ideal mask are calculated. The degrees to which the above error factors affect the exposure latitude required at actual exposure time are calculated from the difference from the ideal mask. The created mask is accepted or rejected depending on whether the influence of the error factors on exposure latitude falls within the previously calculated exposure latitude required at actual exposure time.

Only a mask that has been accepted at the results of the above sequence of measurement steps is allowed to go to the critical pattern portion dimension measurement step (ST. 6) shown in FIG. 1.

The critical pattern portion is one which is small in exposure latitude which is determined by exposure conditions which depend mainly on the shape of a semiconductor device pattern and an exposure system. The critical pattern portion is extracted in advance as shown in ST. 7 in FIG. 1. An example of extraction of the critical pattern portion is as follows.

First, a lithography simulation including process deviations is performed on a part or the whole of a mask pattern. Next, the dimensions or shapes that the mask pattern will have when it is transferred on a semiconductor wafer are calculated. Then, the amounts by which the calculated values are deviated from design values are calculated. Portions in which the amount of deviation exceeds a given amount or is the greatest are extracted. The extracted portions are taken as the critical pattern portions. The critical pattern portions are extracted in this manner by way of example.

The process deviations in the lithography simulation include focus variations, exposure dose variations, and/or lens aberrations in the exposure system.

Figure 5:
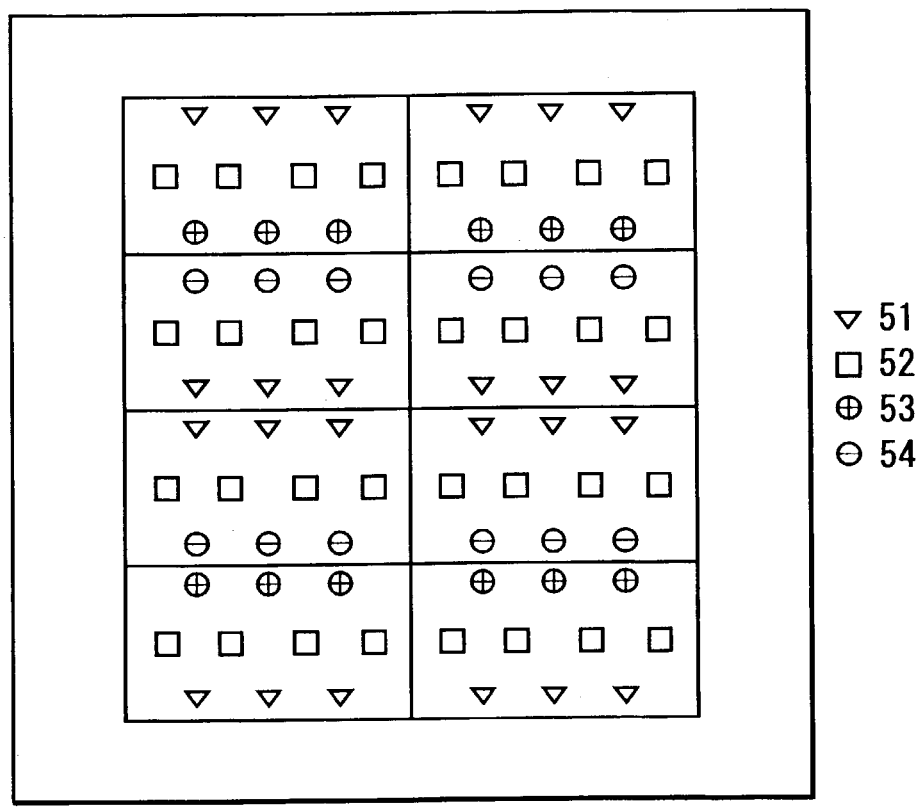
FIG. 5 is a plan view showing critical pattern portions.

In this embodiment, as shown in FIG. 5, the exposure latitudes are classified into categories according to magnitude and into categories 51 to 54 according to the shape and design dimensions of extracted local patterns (ST. 8).

For example, the classification into categories includes at least one of the following classifications:

(1) classification based on the dimensions of critical pattern portions;

(2) classification based on the shapes of critical pattern portions;

(3) classification based on both the dimensions and the shapes of critical pattern portions.

Figure 6A:
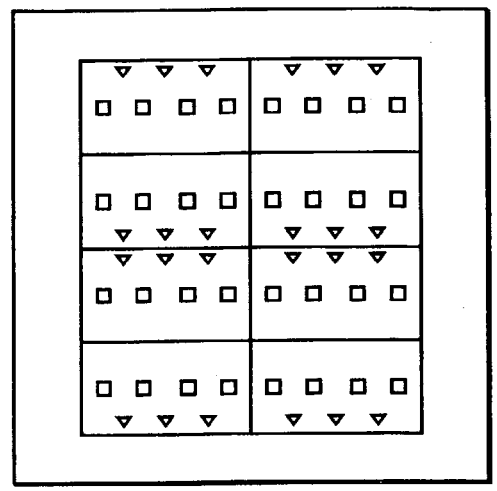
FIGS. 6A, 6B and 6C are plan views showing measurements of dimensions of critical pattern portions.

In measuring the dimensions of critical pattern portions on a created photomask, this embodiment classifies critical patterns (ST. 9). For example, when the average dimension is within ±5 nm above and below the ideal value, only critical pattern portions that fall under the categories 51 and 52 are measured in the critical pattern classification step shown in FIG. 6A. The exposure latitudes for the critical pattern portions are calculated from the differences of measured dimension values from ideal dimension values by category and variations in the measured dimension values. Based on the resultant exposure latitudes, an acceptance/rejection decision is made on the mask in question.

Figure 6B:
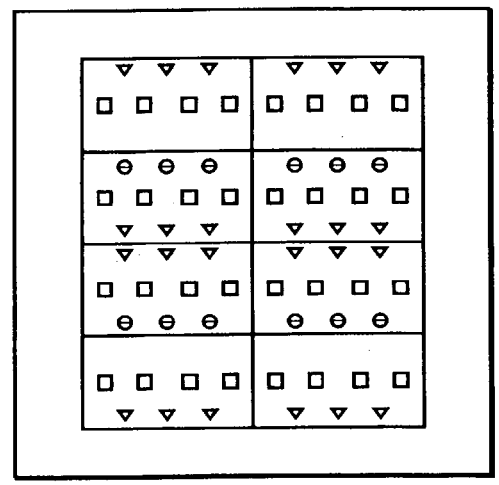
Figure 6C:
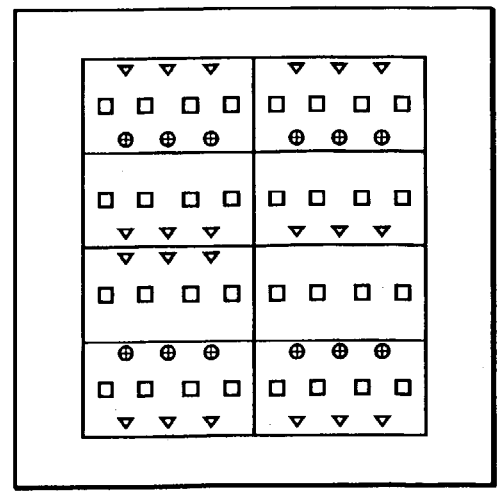

When the average dimension is outside a specific range centered at the ideal value, for example, when the deviation from the ideal value is over −5 nm, a mask acceptance/rejection decision is made, as shown in FIG. 6B, by measuring not only critical pattern portions under categories 51 and 52 but also critical pattern portions under category 54 in which the exposure latitude is more severe. If, on the other hand, the deviation from the ideal value is over +5 nm, a mask acceptance/rejection decision is made, as shown in FIG. 6C, by measuring not only critical pattern portions under categories 51 and 52 but also critical pattern portions under category 53 in which the exposure latitude is more severe.

Thus, the dimensions of the critical pattern portions are measured for each category and a decision is made for each category as to whether or not the photomask can be used to expose a wafer under exposure conditions set in the exposure system.

Figure 7:
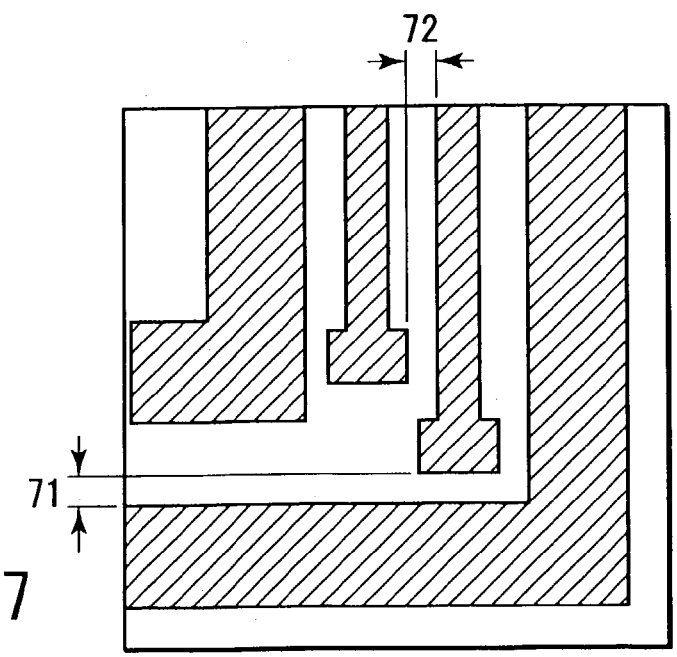
FIG. 7 is a plan view showing parts to be measured of a critical pattern portion.

As an example, a decision of whether or not a photomask can be used to expose a wafer involves performing a lithography simulation on the basis of the dimensions and shapes of critical pattern portions and set exposure conditions to calculate the dimensions and shapes that these critical pattern portions will have when they are transferred onto the wafer. And the decision is made on the basis of the resulting calculations. As a specific example, the dimensions of pattern portions as indicated by 71 and 72 in FIG. 7 are measured. A simulation is performed to confirm whether he pattern portions 71 and 72 will come into contact with their adjacent patterns on exposure processing using the photomask determined from the measured dimensions, peripheral patterns and exposure conditions.

The average dimension values of a mask that has passed the mask inspection including the above mask measurements, obtained in ST. 2, are delivered to an exposure system and the optimum exposure dose is then determined (ST. 10). Using masks that have passed the inspection, a semiconductor device is fabricated.

As described above, according to the photomask manufacturing method of the present invention, a decision is made as to whether the desired exposure latitude is obtained with critical pattern portions included, which are low in exposure latitude determined by exposure conditions which depend mainly on the semiconductor device pattern shape and the exposure system.

In contrast to the inventive method, the techniques disclosed in Japanese Patent Application No. 2000-260285 and Japanese Patent Application No. 2001-159380 offer no mask certification including critical pattern portions which are low in exposure latitude.

Thus, the inventive method allows more accurate acceptance/rejection decision of photomasks than the techniques disclosed in Japanese Patent Application No. 2000-260285 and Japanese Patent Application No. 2001-159380.

Further, in the inventive method, the critical pattern portions are selected according to photomask pattern formation conditions.

An example of a method of selecting the critical pattern portions is to, as described previously, perform a lithography simulation including process deviations on a part or the whole of a mask pattern. Next, the dimensions or shapes that the mask pattern will have when it is transferred on a semiconductor wafer are calculated. The amounts by which the calculated values are deviated from design values are then calculated. Portions in which the amount of deviation exceeds a given amount or is the greatest are extracted. The extracted portions are taken as the critical pattern portions.

Such critical pattern portions are places where the amount of deviation exceeds a given amount or is the greatest are extracted. The acceptance/rejection decision of photomasks taking such places into consideration can be expected to provide more accurate decision.

The critical pattern portions may be extracted taking the measured values of the average dimension monitoring portions obtained in ST. 2 in FIG. 1 on optimization of exposure conditions in an exposure system and their deviations from design values.

Thus, the photomask manufacturing method of the present invention allows more accurate acceptance/rejection decision of photomask.

The present invention is not limited to the above embodiment. For example, the desired exposure latitude may be changed according to ease of fabrication of devices and resist characteristics. In calculations to estimate the exposure latitude, it may be determined directly from an optical image. The exposure latitude may be determined from calculations including resist characteristics and etching characteristics, which allows more accurate decision. The pattern for which the exposure latitude is determined is not limited to a cell pattern. It is desirable to estimate a portion which is considered to be the lowest in exposure latitude, such as a core circuit. In the case of a phase-shifting mask, if the phase and the transmission factor are difficult to measure, it is also possible to calculate the exposure latitude using the specifications values of the phase and the transmission factor.

Although the embodiment has been described as assuming the object pattern to be a semiconductor memory device pattern, the present invention can be applied to a logic device with little or no repeatability of the pattern. In the case of a logic device, a pattern portion in which average dimensions are determined and a pattern portion in which dimension variations are determined are separately set up. The present invention may be practiced or embodied in still other ways without departing from the scope and sprit thereof.

The above embodiment includes inventions at various stages, which can be extracted by appropriate combinations of constituent elements disclosed in the above description.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a photomask comprising:
   determining dimensions of a pattern in a photomask including dimensions of critical pattern portions in which an exposure latitude is low;
   determining an exposure latitude on the basis of the dimensions of the mask; and
   judging if the photomask is defective or non-defective on the basis of whether or not the exposure latitude falls within a prescribed exposure latitude.

2. The method according to claim 1, wherein the dimensions of the pattern are determined including the dimensions of average dimension monitoring portions and the dimensions of dimension variation monitoring portions, the average dimension monitoring portions being ones utilized for optimizing exposure conditions of an exposure system and the dimensions of dimension variation monitoring portions being ones utilized for calculating variations in the dimensions of the pattern.

3. The method according to claim 1, further comprising:
   performing a lithography simulation including process deviations on a par or the whole of the pattern to calculate values for the dimensions or shapes when the pattern is transferred onto a semiconductor wafer
   calculating deviations of the calculated values from design values; and
   extracting portions in which the deviations exceed a prescribed deviation or the deviations are the greatest as the critical pattern portions.

4. The method according to claim 3, wherein the process deviations include focus variations of the exposure system, exposure dose variations of the exposure system and/or lens aberration the exposure system.

5. The method according to claim 2, wherein the critical pattern portions are extracted on the basis of deviations of measured values of the average dimension monitoring portions obtained in optimizing the exposure conditions of the exposure system from design values.

6. The method according to claim 1, wherein the critical pattern portions are classified into categories including the dimensions of the critical pattern portions, the shape of the critical pattern portions, and/or combination of the dimensions and shape of the critical pattern portions,
   the dimensions of the critical pattern portions are measured for each category, and
   a judgment is made as to whether or not the photomask can be exposed under prescribed exposure conditions of an exposure system including the measurements of the dimensions for each category.

7. The method according to claim 6, wherein the judgment of whether or not the photomask can be exposed under exposure conditions is made by performing a lithography simulation on the basis of the dimensions and shapes of the critical pattern portions and the exposure conditions, and calculating the dimensions and shapes that the critical pattern portions will have when they are transferred onto a semiconductor wafer.

8. A method of manufacturing a semiconductor device comprising:
   determining dimensions of a pattern in a photomask including dimensions of critical pattern portions in which an exposure latitude is low;
   determining an exposure latitude on the basis of the dimensions of the mask;

judging if the photomask is defective or non-defective on the basis of whether or not the exposure latitude falls within a prescribed exposure latitude; and manufacturing a semiconductor device using a photomask that has been accepted on the basis of the judgment.

9. The method according to claim 8, wherein the dimensions of the pattern are determined including the dimensions of average dimension monitoring portions and the dimensions of dimension variation monitoring portions, the average dimension monitoring portions being ones utilized for optimizing exposure conditions of an exposure system and the dimensions of dimension variation monitoring portions being ones utilized for calculating variations in the dimensions of the pattern.

10. The method according to according to claim 8, further comprising performing a lithography simulation including process deviations on a par or the whole of the pattern to calculate values for the dimensions or shapes when the pattern is transferred onto a semiconductor wafer calculating deviations of the calculated values from design values; and extracting portions in which the deviations exceed a prescribed deviation or the deviations are the greatest as the critical pattern portions.

11. The method according to claim 10, wherein the process deviations include focus variations of the exposure system, exposure dose variations of the exposure system and/or lens aberration the exposure system.

12. The method according to according to claim 9, wherein the critical pattern portions are extracted on the basis of deviations of measured values of the average dimension monitoring portions obtained in optimizing the exposure conditions of the exposure system from design values.

13. The method according to according to claim 8, wherein the critical pattern portions are classified into categories including the dimensions of the critical pattern portions, the shape of the critical pattern portions, and/or combination of the dimensions and shape of the critical pattern portions, the dimensions of the critical pattern portions are measured for each category, and a judgment is made as to whether or not the photomask can be exposed under prescribed exposure conditions of an exposure system including the measurements of the dimensions for each category.

14. The method according to according to claim 13, wherein the judgment of whether or not the photomask can be exposed under exposure conditions is made by performing a lithography simulation on the basis of the dimensions and shapes of the critical pattern portions and the exposure conditions, and calculating the dimensions and shapes that the critical pattern portions will have when they are transferred onto a semiconductor wafer.

* * * * *

UNITED STATES PATENT AND TRADEMARK OFFICE
CERTIFICATE OF CORRECTION

PATENT NO.      : 7,008,731 B2                          Page 1 of 1
APPLICATION NO. : 10/374094
DATED           : March 7, 2006
INVENTOR(S)     : Nojima et al.

It is certified that error appears in the above-identified patent and that said Letters Patent is hereby corrected as shown below:

Column 8,
Line 36, change "aberration the" to -- aberration of the --.

Column 9,
Line 15, delete "according to" (second occurrence).
Line 29, change "aberration the" to -- aberration of the --.

Column 10,
Lines 1, 7 and 20, delete "according to" (second occurrence).

Signed and Sealed this

Twentieth Day of June, 2006

JON W. DUDAS
*Director of the United States Patent and Trademark Office*